(12) United States Patent
Yang et al.

(10) Patent No.: US 12,274,051 B2
(45) Date of Patent: Apr. 8, 2025

(54) METAL GATE MEMORY DEVICE AND METHOD

(71) Applicant: Micron Technology, Inc., Boise, ID (US)

(72) Inventors: Hyucksoo Yang, Meridian, ID (US); Jongpyo Kim, Boise, ID (US); Byung Yoon Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 17/717,406

(22) Filed: Apr. 11, 2022

(65) Prior Publication Data

US 2023/0328966 A1    Oct. 12, 2023

(51) Int. Cl.
| | |
|---|---|
| *G11C 11/40* | (2006.01) |
| *G11C 11/4091* | (2006.01) |
| *G11C 11/4097* | (2006.01) |
| *H01B 1/02* | (2006.01) |
| *H01L 29/51* | (2006.01) |
| *H10B 12/00* | (2023.01) |
| *H01Q 1/22* | (2006.01) |

(52) U.S. Cl.
CPC .......... *H10B 12/48* (2023.02); *G11C 11/4091* (2013.01); *G11C 11/4097* (2013.01); *H01B 1/02* (2013.01); *H01L 29/517* (2013.01); *H10B 12/05* (2023.02); *H01Q 1/2258* (2013.01)

(58) Field of Classification Search
CPC .......... H10B 12/48; H10B 12/05; H01B 1/02; G11C 11/4091; G11C 11/4097; H01L 29/517; H01Q 1/2258
See application file for complete search history.

(56) References Cited

U.S. PATENT DOCUMENTS

| | | | |
|---|---|---|---|
| 5,604,140 A * | 2/1997 | Byun | H01L 21/76855 438/653 |
| 6,207,998 B1 * | 3/2001 | Kawasaki | G11C 11/4097 257/532 |
| 6,501,672 B1 * | 12/2002 | Sekiguchi | G11C 7/02 365/207 |
| 2007/0211509 A1 * | 9/2007 | Vollrath | G11C 11/4097 257/E21.657 |
| 2011/0241102 A1 * | 10/2011 | Cho | H01L 29/78 257/329 |
| 2015/0371991 A1 * | 12/2015 | Nobuto | H10B 12/482 257/330 |
| 2020/0135259 A1 * | 4/2020 | Tomishima | G06F 12/0246 |

\* cited by examiner

*Primary Examiner* — Xiaochun L Chen
(74) *Attorney, Agent, or Firm* — Schwegman Lundberg & Woessner, P.A.

(57) ABSTRACT

Apparatus and methods are disclosed, including memory devices and systems. Example memory devices, systems and methods include an array of memory cells and a transistor located on a periphery of the array of memory cells. A number of data lines are shown coupled to memory cells in the array, wherein the number of data lines extend over a first metal gate of a transistor in the periphery of the array, where the number of data lines are formed from a second metal, and form a direct interface with the first metal gate.

21 Claims, 6 Drawing Sheets

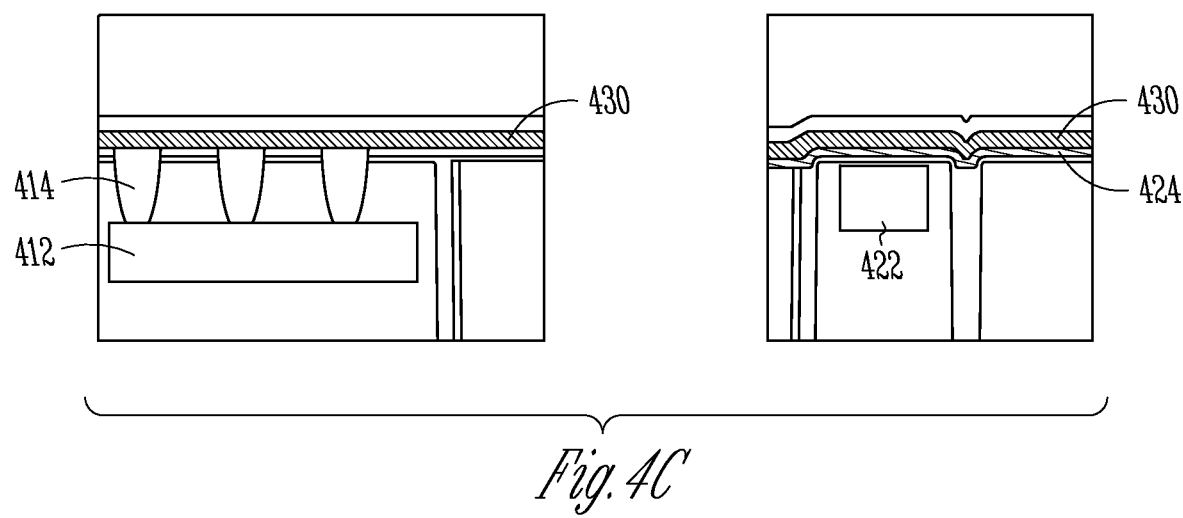

METAL GATE MEMORY DEVICE AND METHOD

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

The present description addresses relates generally to example structures and methods for transistor configurations in memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4A-4C illustrate selected manufacturing steps of portions of a memory device in accordance with some example embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
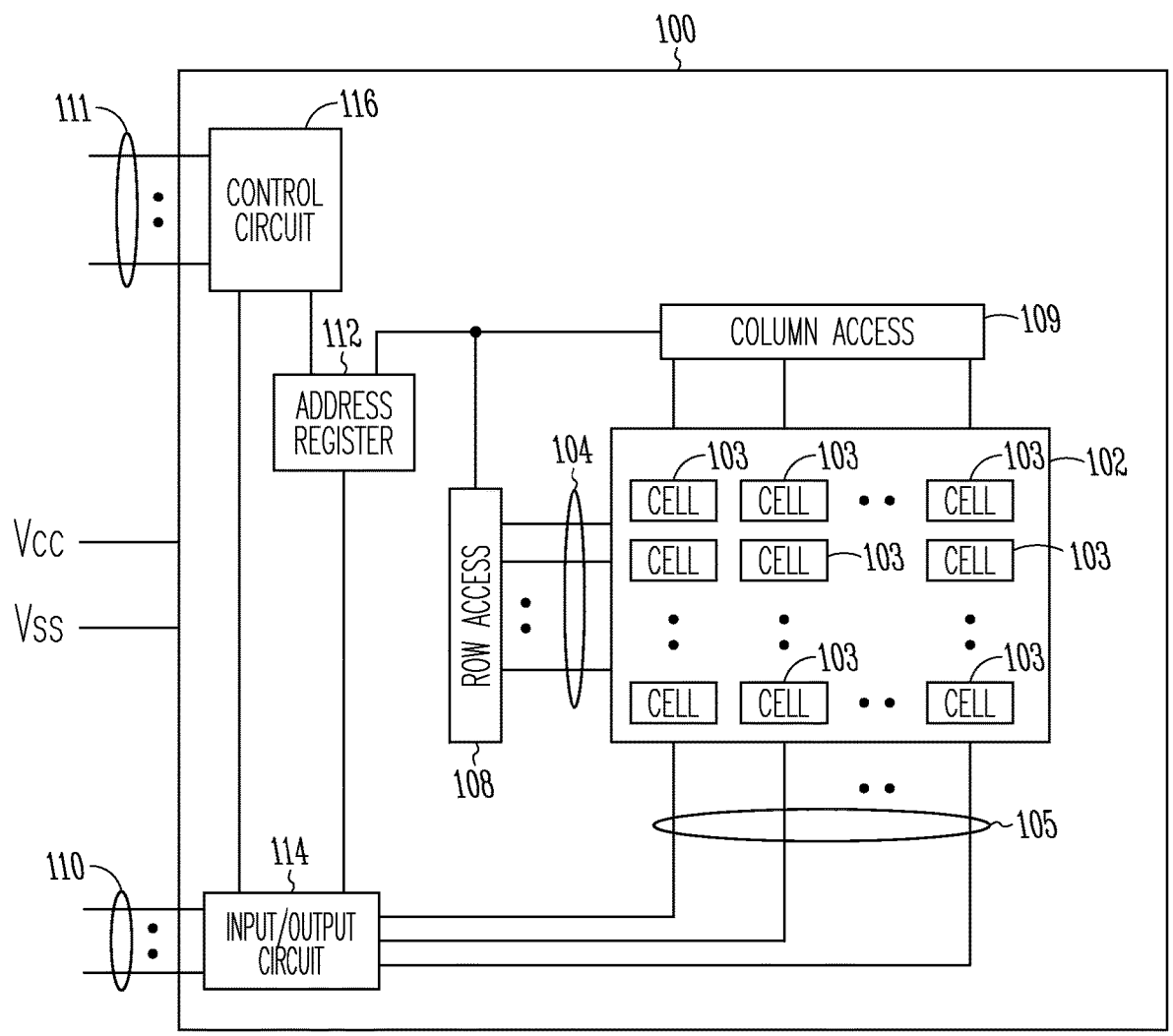
FIG. 1 illustrates a memory device in accordance with some example embodiments.

FIG. 1 shows a block diagram of an apparatus in the form of a memory device 100, according to an embodiment of the invention. The memory device 100 may include one or more transistors with gates as described in examples below. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

Figure 2:
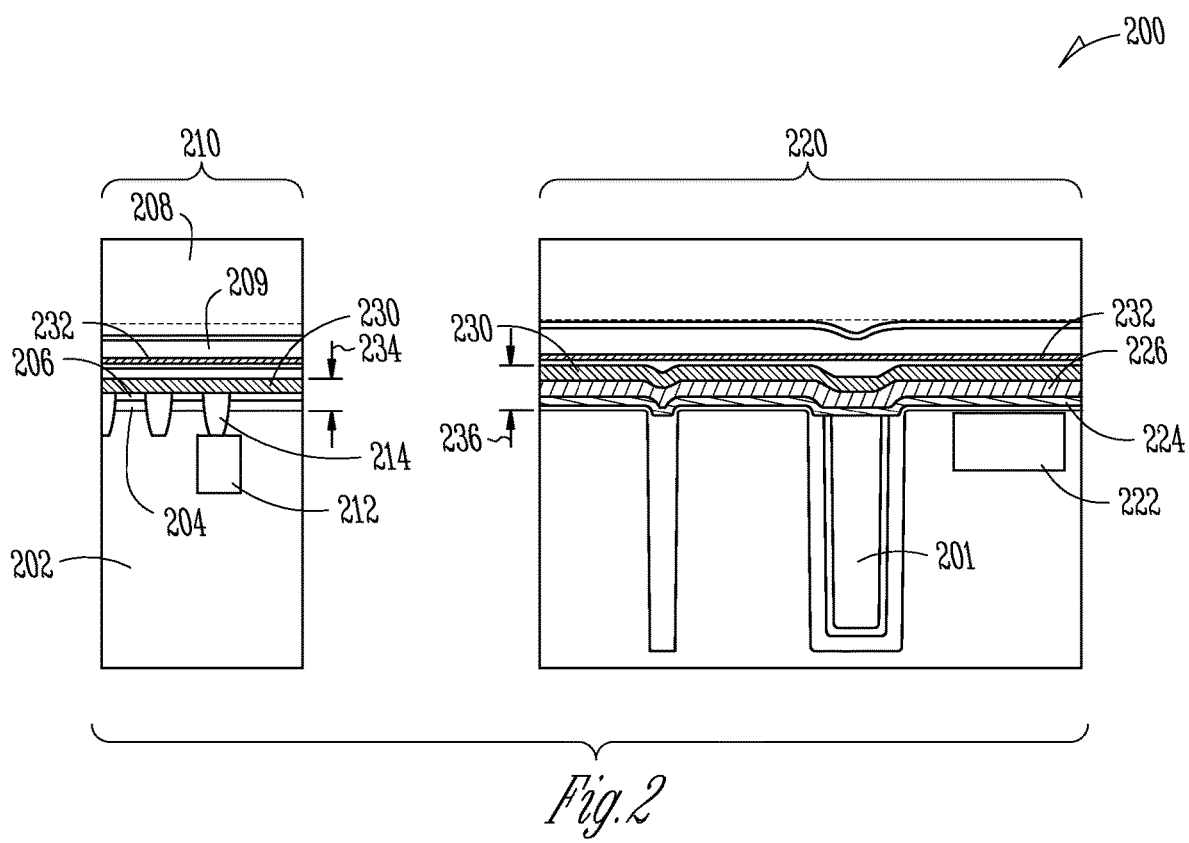
FIG. 2 illustrates portions of a memory device in accordance with some example embodiments.

FIG. 2 shows selected components of a memory device 200. The memory device 200 includes an array portion 210 and a peripheral portion 220 formed in a semiconductor substrate 202. In one example, the array portion 210 corresponds to the array 102 from FIG. 1, and the peripheral portion 220 corresponds to circuits including, but not limited to column access 109 circuitry and row access circuitry 108 from FIG. 1.

A number of different material layers are shown in FIG. 2. Some layers differ from the array portion 210 and the peripheral portion 220. An oxide layer 204 and a nitride layer 206 are shown beneath a conductor layer. In one example, the conductor layer is patterned to form one or more data lines 230 that are coupled to individual memory cells 212 within the array portion 210. A number of contact plugs 214 are shown coupling one or more data lines 230 to the memory cells 212.

In one example, conductors such as data lines 230 are formed from metal based materials. In one example, a metal based material includes one or more elemental metal, such as tungsten, titanium, aluminum, lanthanum, magnesium, etc. In one example, a metal based material includes an alloy of more than one elemental metal. In one example, a metal based material includes an elemental metal combined with another element such as nitrogen or carbon, where the resulting material is conductive. Examples of such metal based conductive materials includes, but is not limited to, titanium nitride, tungsten nitride, tantalum nitride, titanium aluminum carbide, etc. One of ordinary skill in the art, having the benefit of the present disclosure, will recognize that a definition of a conductive material is a continuum with respect to dielectric materials. Practically, a conductive material will function to transmit an electrical signal along a pathway formed from the conductive material. The pathway may be further defined by partially or fully encasing the conductive material in a dielectric material that is less conductive than the conductive material.

Layers of the memory device 200 in FIG. 2 further include a nitride layer 209 and an oxide layer 208 formed over the data lines 230. Although a nitride layer 209 and an oxide layer 208 are shown, other dielectrics are within the scope of the invention, and a single layer or more than two layers are also within the scope of the invention.

The peripheral portion 220 further includes a transistor 222 shown in block diagram form. An isolation structure 201 is shown electrically separating the array portion 210 from the peripheral portion 220. A work function metal 224 is shown in the peripheral portion 220 that forms part of a gate from the transistor 222. Examples of work function metals include, but are not limited to, titanium nitride, aluminum, lanthanum, magnesium, titanium aluminum carbide, tantalum nitride, etc. In one example, the work function metal 224 include electrical properties (for example, a work function value) that are chosen to provide good operating characteristics of an adjacent transistor channel that is included within transistor 222.

FIG. 2 further includes a polysilicon layer 226. In selected examples, a polysilicon layer is deposited across both the array portion 210 and the peripheral portion 220, and is used to protect vulnerable structures below from processing operations, such as chemical etching. In FIG. 2, the polysilicon layer 226 is shown between the work function metal 224 and the data lines 230 that extend between the array portion 210 and the peripheral portion 220.

In manufacture, a planarization step is performed to level a top surface of both the array portion 210 and the peripheral portion 220. Line 232 shows a planarization line that does not disturb any components on either the array portion 210 on the peripheral portion 220. Because a thickness 236 within the peripheral portion 220 is thicker than a thickness 234 within the array portion 210, line 232 must be placed conservatively to not disturb any thicker components beneath the peripheral portion 220.

Figure 3:
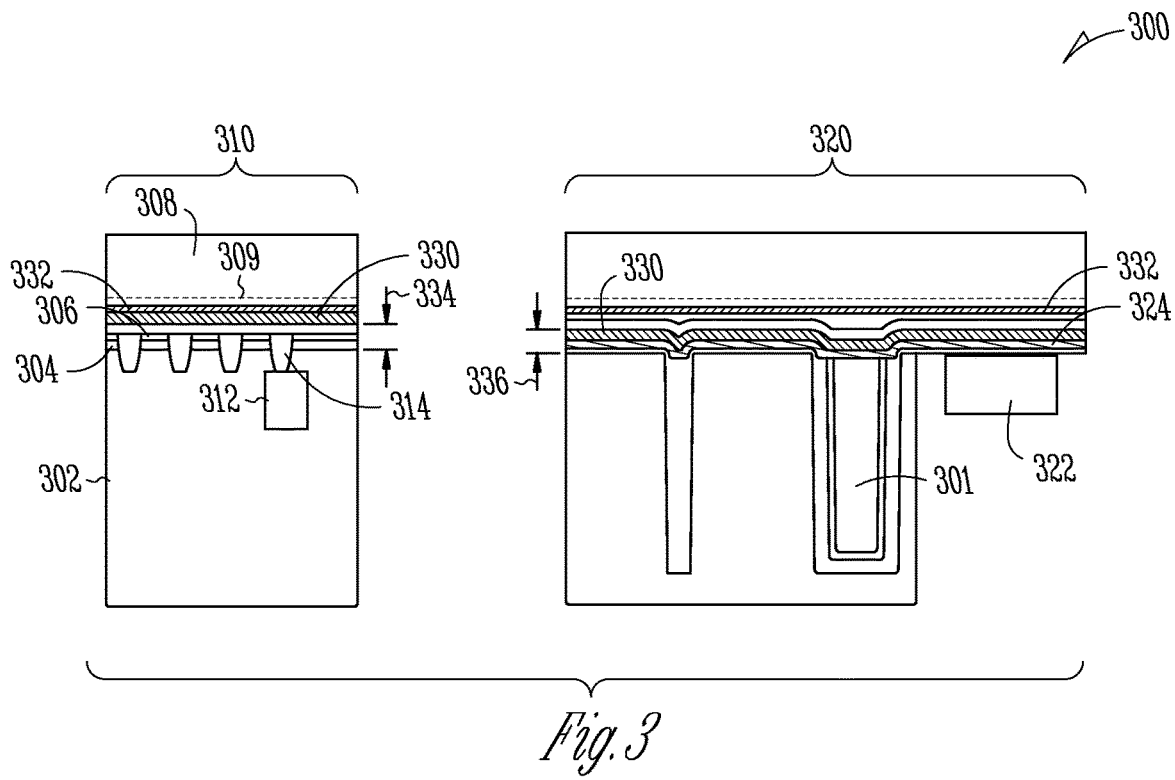
FIG. 3 illustrates portions of a memory device in accordance with some example embodiments.

FIG. 3 shows selected components of a memory device 300. The memory device 300 includes an array portion 310 and a peripheral portion 320 formed in a semiconductor substrate 302. In one example, the array portion 310 corresponds to the array 102 from FIG. 1, and the peripheral portion 320 corresponds to circuits including, but not limited to column access 109 circuitry and row access circuitry 108 from FIG. 1.

Similar to the memory device 200 of FIG. 2, The memory device 300 of FIG. 3 includes an oxide layer 304 and a nitride layer 306, data lines 330, and a nitride layer 309 and an oxide layer 308 formed over the data lines 330. Data lines 330 are shown coupled to individual memory cells 312 within the array portion 310. A number of contact plugs 314 are shown coupling one or more data lines 330 to the memory cells 312. In the peripheral portion 320, a transistor 322 shown in block diagram form. An isolation structure 301 is shown electrically separating the array portion 310 from the peripheral portion 320. A work function metal 324 is shown in the peripheral portion 320 that forms part of a gate from the transistor 322.

In FIG. 3, there is no polysilicon layer 226 between the work function metal 324 and the data lines 330, which allows the data lines 330 to form a direct interface with the work function metal 324 in a gate of the transistor 322. This configuration provides a number of advantages. One advantage includes a thickness 336 within the peripheral portion 320 that is similar to a thickness 334 within the array portion 310. This allows a planarization line 332 that results in a thinner device across the array portion 310 and the peripheral portion 320, and is less likely to disturb any components on either the array portion 210 or the peripheral portion 220. Without the polysilicon layer 226, a larger number of compatible metals may also be chosen for the data lines 330 because compatibility with polysilicon is not required. This allows for material choices of data lines 330 that may improve overall performance of the memory device 330. This configuration is particularly beneficial in a dynamic random access memory (DRAM) array as illustrated in FIG.

3, because the array portion 310 does not utilize a work function metal, while the peripheral portion 320 uses a work function metal 324 as part of a gate structure. Examples of DRAM include, but are not limited to, graphic DRAM, mobile DRAM, etc.

Figure 4A:
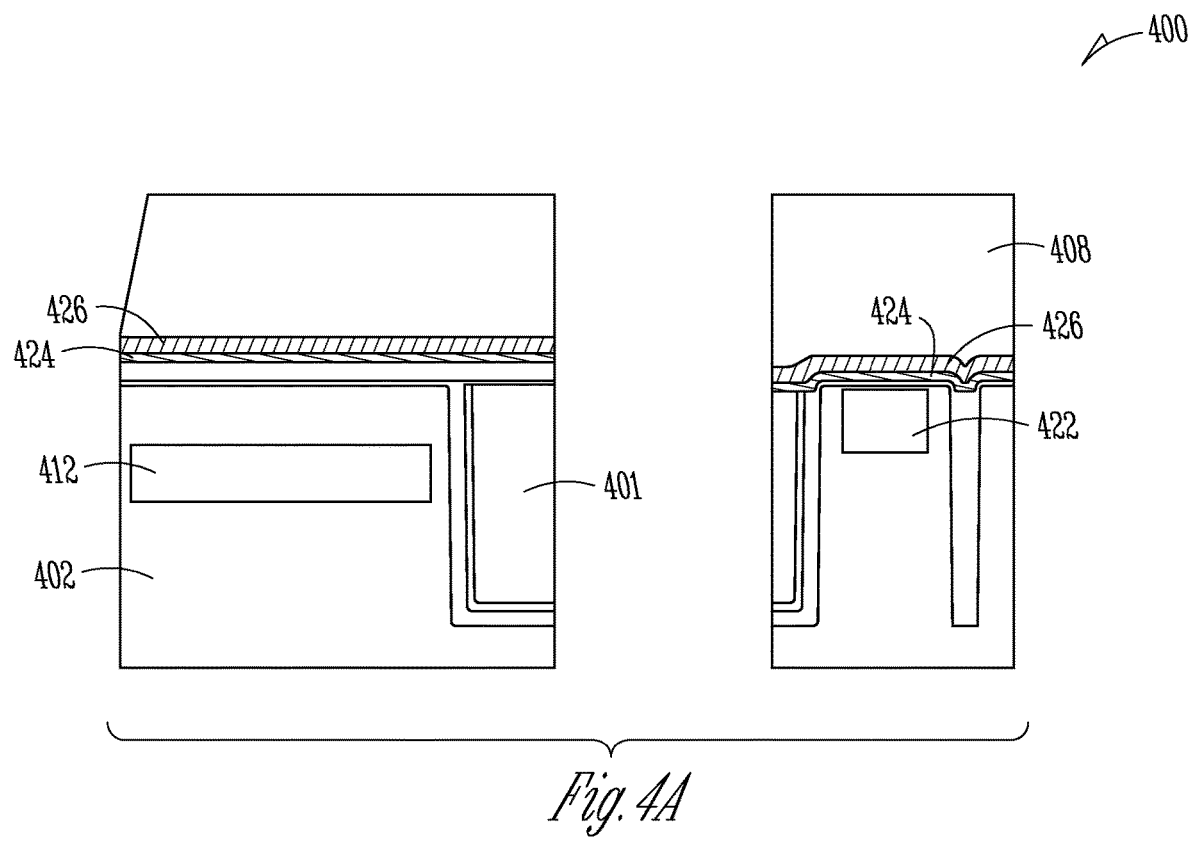
Figure 4B:
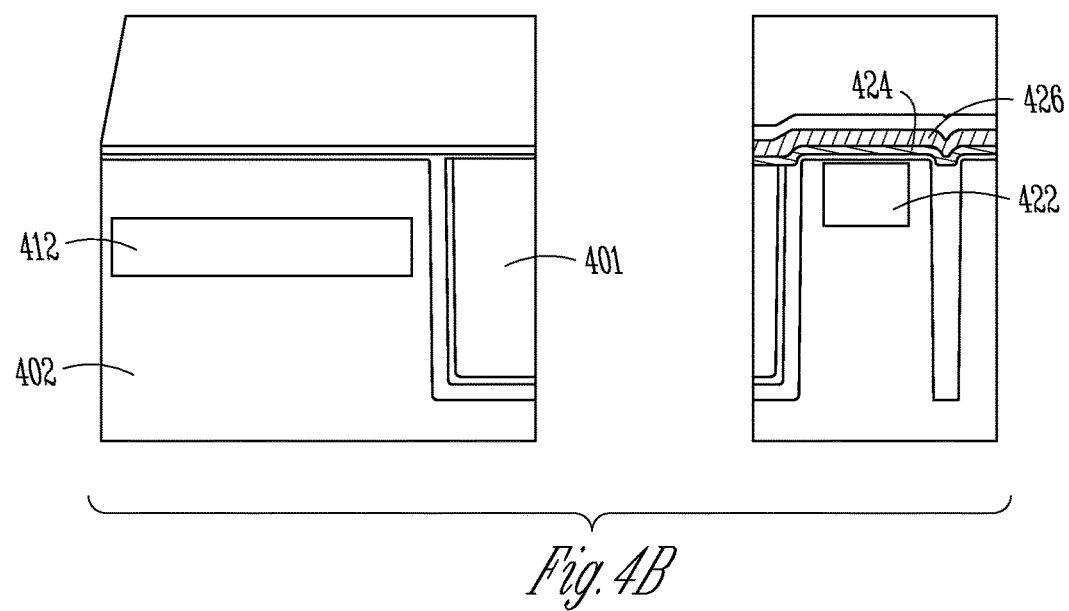

FIGS. 4A-4C show selected cross sections of stages of manufacturing of a memory device 400 similar to memory devices 100 and 300 shown above. In FIG. 4A, an array of memory cells 412 shown in block diagram format are located within a semiconductor substrate 402, and peripheral transistors 422 are separated from the array of memory cells 412 by an isolation structure 401. A work function metal layer 424 and a polysilicon layer 426 are deposited over both the array of memory cells 412 and the peripheral transistors 422. One or more layers of dielectric 408 are formed over the work function metal layer 424 and polysilicon layer 426.

In FIG. 4B, the work function metal layer 424 and polysilicon layer 426 are removed from the array portion over the array of memory cells 412. The work function metal layer 424 and polysilicon layer 426 are masked off in a peripheral portion, and remain in gate regions of the peripheral transistors 422.

In FIG. 4C, the polysilicon layer 426 has been removed, and contact plugs 414 are formed to contact memory cells in the array of memory cells 412. A conductive layer 430 is formed over the contact plugs 414 in the array portion, and in direct contact with the work function metal layer 424 in the peripheral portion. The conductive layer 430 is patterned and processed to form data lines and portions of gates in the peripheral transistors 422. In the example of FIG. 4C the conductive layer 430 is continuous across the array portion and the peripheral portion, and electrical communication between the array portion and the peripheral portion is enhanced.

Figure 5:
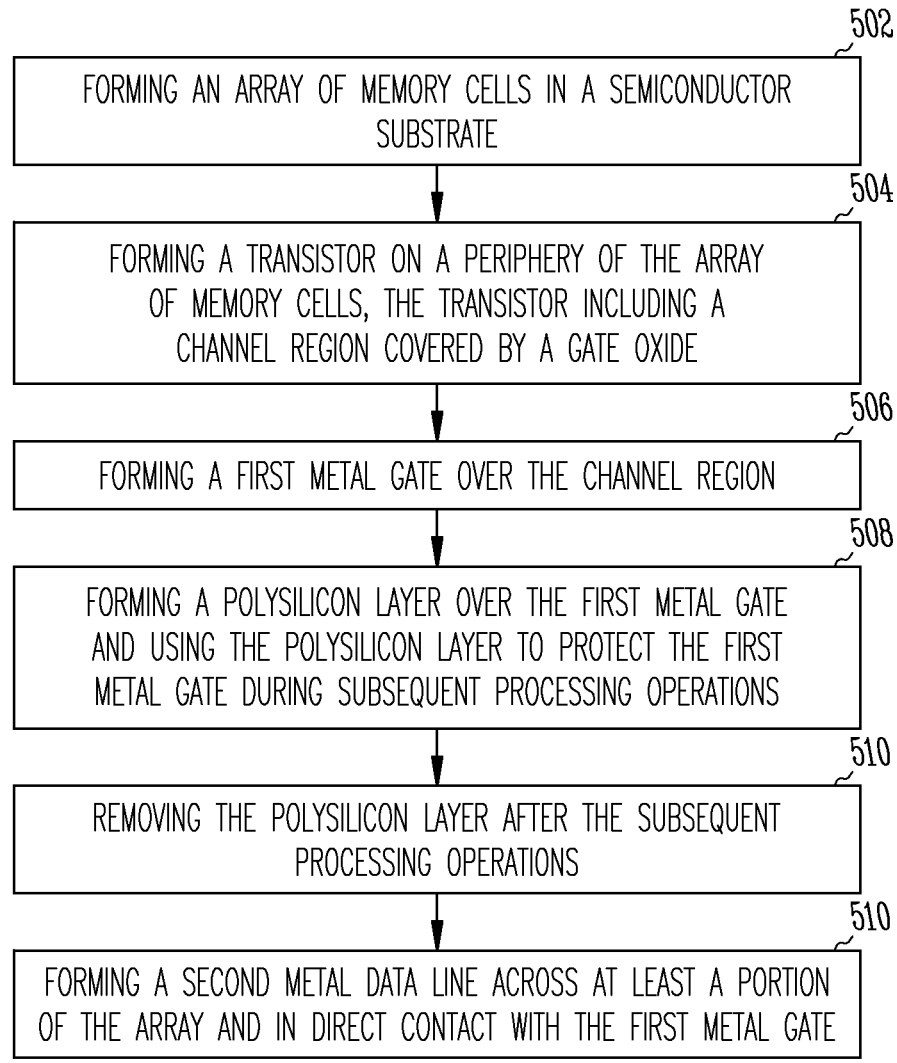
FIG. 5 illustrates an example method flow diagram in accordance with other example embodiments.

FIG. 5 shows an example flow diagram of a method of manufacture of a memory device similar to examples above. In operation 502, an array of memory cells is formed in a semiconductor substrate. In operation 504, a transistor is formed on a periphery of the array of memory cells, the transistor including a channel region covered by a gate oxide. In operation 506, a first metal gate is formed over the channel region. In operation 508, a polysilicon layer is formed over the first metal gate. In operation 510, the polysilicon layer is removed after subsequent processing operations, and in operation 512, a second metal data line is formed across at least a portion of the array and in direct contact with the first metal gate.

Figure 6:
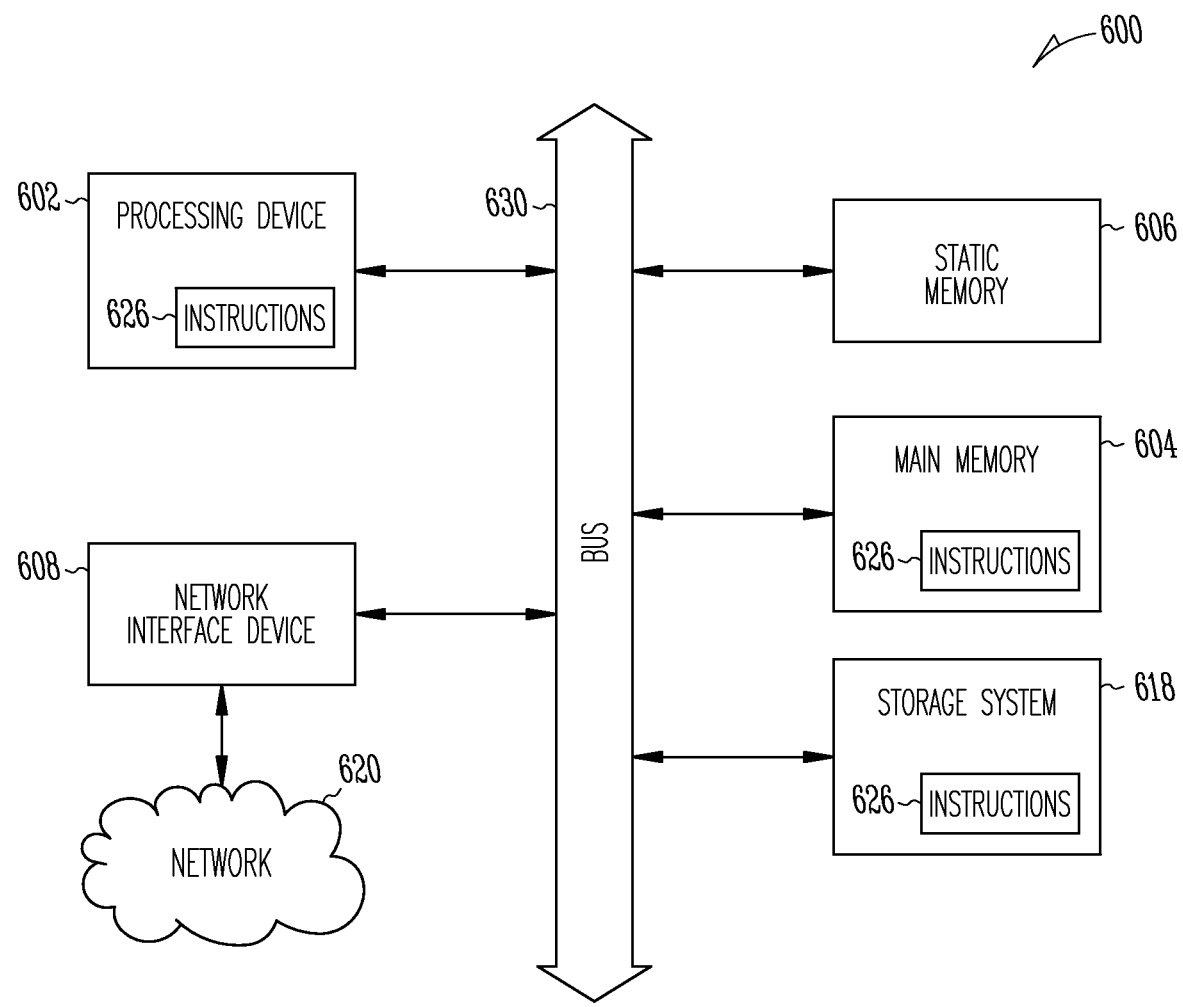
FIG. 6 illustrates an example block diagram of an information handling system in accordance with some example embodiments.

FIG. 6 illustrates a block diagram of an example machine (e.g., a host system) 600 which may include one or more memory devices and/or memory systems as described above. As discussed above, machine 600 may benefit from enhanced memory performance from use of one or more of the described memory devices and/or memory systems, facilitating improved performance of machine 600 (as for many such machines or systems, efficient reading and writing of memory can facilitate improved performance of a processor or other components that machine, as described further below.

In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630. In one example, the main memory 604 includes one or more memory devices as described in examples above.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

Example 1 is a memory device. The memory device includes an array of memory cells, a transistor located on a periphery of the array of memory cells, the transistor including a channel region with a first metal gate formed over the channel region and separated from the channel region by a gate oxide, and a number of data lines coupled to memory cells in the array, wherein the number of data lines extend over the first metal gate, the number of data lines formed from a second metal, and forming a direct interface with the first metal gate.

In Example 2, the memory device of Example 1 optionally includes wherein the array of memory cells includes an array of DRAM cells.

In Example 3, the memory device of any one of Examples 1-2 optionally includes wherein the transistor is including in data sensing circuitry.

In Example 4, the memory device of any one of Examples 1-3 optionally further includes an electrical isolation structure formed in a semiconductor substrate between the array of memory cells and the transistor.

In Example 5, the memory device of any one of Examples 1-4 optionally includes wherein the second metal includes tungsten.

In Example 6, the memory device of any one of Examples 1-5 optionally includes wherein the first metal gate includes titanium.

In Example 7, the memory device of any one of Examples 1-6 optionally includes wherein the number of data lines are coupled to the memory cells with contact plugs including titanium.

In Example 8, the memory device of any one of Examples 1-7 optionally further includes a layer of silicon nitride covering the data lines in the array and transistor located on the periphery.

In Example 9, the memory device of any one of Examples 1-8 optionally includes wherein the layer of silicon nitride includes a planarized top surface.

Example 10 is a method. The method includes forming an array of memory cells in a semiconductor substrate, forming a transistor on a periphery of the array of memory cells, the transistor including a channel region covered by a gate oxide, forming a first metal gate over the channel region, forming a polysilicon layer over the first metal gate and using the polysilicon layer to protect the first metal gate during subsequent processing operations, removing the polysilicon layer after the subsequent processing operations, and forming a second metal data line across at least a portion of the array and in direct contact with the first metal gate.

In Example 11, the method of Example 10 optionally includes wherein removing the polysilicon layer includes reducing a first level of the periphery down to a second level substantially the same as in the array.

In Example 12, the method of any one of Examples 10-11 optionally further includes forming a silicon nitride layer over the array of memory cells and over the transistor on the periphery of the array of memory cells.

In Example 13, the method of any one of Examples 10-12 optionally further includes planarizing a top surface of the silicon nitride layer over the array of memory cells and over the transistor on the periphery of the array of memory cells.

In Example 14, the method of any one of Examples 10-13 optionally includes wherein forming the first metal gate includes forming a titanium nitride gate.

In Example 15, the method of any one of Examples 10-14 optionally includes wherein forming a second metal data line includes forming a data line including tungsten.

Example 16 is a computing system. The computing system of Example 16 includes one or more processing cores and a DRAM memory coupled to the one or more processing cores. The DRAM memory includes an array of memory cells, a transistor located on a periphery of the array of memory cells, the transistor including a channel region with a first metal gate formed over the channel region and separated from the channel region by a gate oxide, and a number of data lines coupled to memory cells in the array, wherein the number of data lines extend over the first metal gate, the number of data lines formed from a second metal, and forming a direct interface with the first metal gate.

In Example 17, the computing system of Example 16 optionally further includes a network interface device coupled to the one or more processing cores.

In Example 18, the computing system of any one of Examples 16-17 optionally includes wherein the network interface device includes one or more antennae.

In Example 19, the computing system of any one of Examples 16-18 optionally includes wherein the second metal includes tungsten.

In Example 20, the computing system of any one of Examples 16-19 optionally includes wherein the first metal gate includes titanium.

In Example 21, the computing system of any one of Examples 16-20 optionally includes wherein the transistor is including in data sensing circuitry.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device, comprising:
   an array of memory cells;
   a transistor located on a periphery of the array of memory cells, the transistor including a channel region with a first metal gate formed over the channel region and separated from the channel region by a gate oxide; and
   a number of data lines coupled to memory cells in the array, wherein the number of data lines physically extend over the first metal gate, the number of data lines formed from a second metal, and wherein a bottom side of the number of data lines forms a direct interface with the first metal gate, without any intervening structure between the bottom side of the number of data lines and the first metal gate.

2. The memory device of claim 1, wherein the array of memory cells includes an array of DRAM cells.

3. The memory device of claim 1, wherein the transistor is included in data sensing circuitry.

4. The memory device of claim 1, further including an electrical isolation structure formed in a semiconductor substrate between the array of memory cells and the transistor.

5. The memory device of claim 1, wherein the second metal includes tungsten.

6. The memory device of claim 1, wherein the first metal gate includes titanium.

7. The memory device of claim 1, wherein the number of data lines are coupled to the memory cells with contact plugs including titanium.

8. The memory device of claim 1, further including a layer of silicon nitride covering the data lines in the array and transistor located on the periphery.

9. The memory device of claim 8, wherein the layer of silicon nitride includes a planarized top surface.

10. A method, comprising:
    forming an array of memory cells in a semiconductor substrate;
    forming a transistor on a periphery of the array of memory cells, the transistor including a channel region covered by a gate oxide;
    forming a first metal gate over the channel region;
    forming a polysilicon layer over the first metal gate and using the polysilicon layer to protect the first metal gate during subsequent processing operations;
    removing the polysilicon layer after the subsequent processing operations; and
    forming a second metal data line across at least a portion of the array and in direct contact with the first metal gate.

11. The method of claim 10, wherein removing the polysilicon layer includes reducing a first level of the periphery down to a second level substantially the same as in the array.

12. The method of claim 10, further including forming a silicon nitride layer over the array of memory cells and over the transistor on the periphery of the array of memory cells.

13. The method of claim 10, further including planarizing a top surface of the silicon nitride layer over the array of memory cells and over the transistor on the periphery of the array of memory cells.

14. The method of claim 10, wherein forming the first metal gate includes forming a titanium nitride gate.

15. The method of claim 10, wherein forming a second metal data line includes forming a data line including tungsten.

16. A computing system, comprising:
one or more processing cores;
a DRAM memory coupled to the one or more processing cores, the DRAM memory including;
an array of memory cells;
a transistor located on a periphery of the array of memory cells, the transistor including a channel region with a first metal gate formed over the channel region and separated from the channel region by a gate oxide; and
a number of data lines coupled to memory cells in the array, wherein the number of data lines physically extend over the first metal gate, the number of data lines formed from a second metal, and wherein a bottom side of the number of data lines forms a direct interface with the first metal gate, without any intervening structure between the bottom side of the number of data lines and the first metal gate.

17. The computing system of claim 16, further including a network interface device coupled to the one or more processing cores.

18. The computing system of claim 17, wherein the network interface device includes one or more antennae.

19. The computing system of claim 16, wherein the second metal includes tungsten.

20. The computing system of claim 16, wherein the first metal gate includes titanium.

21. The computing system of claim 16, wherein the transistor is including in data sensing circuitry.

\* \* \* \* \*